(12) United States Patent
Yang et al.

(10) Patent No.: US 9,585,270 B2
(45) Date of Patent: Feb. 28, 2017

(54) ROUTER

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Chun-Wei Yang, Wuhan (CN); Yong-Nian Chen, Wuhan (CN); Li-Fu Xu, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 205 days.

(21) Appl. No.: 14/614,844

(22) Filed: Feb. 5, 2015

(65) Prior Publication Data
US 2016/0174294 A1 Jun. 16, 2016

(30) Foreign Application Priority Data
Dec. 12, 2014 (CN) .......................... 2014 1 0760520

(51) Int. Cl.
H05K 5/02 (2006.01)
G06F 1/18 (2006.01)
G06K 7/00 (2006.01)

(52) U.S. Cl.
CPC ............. *H05K 5/0247* (2013.01); *G06F 1/18* (2013.01)

(58) Field of Classification Search
None
See application file for complete search history.

(56) References Cited

U.S. PATENT DOCUMENTS

| | | | | |
|---|---|---|---|---|
| 5,694,291 A * | 12/1997 | Feightner | ................ | G06F 1/184 361/679.6 |
| 6,078,504 A * | 6/2000 | Miles | ...................... | G06F 1/184 174/17 CT |
| 6,198,633 B1 * | 3/2001 | Lehman | ..................... | G06F 1/18 312/332.1 |
| 6,678,535 B1 * | 1/2004 | Narayanaswami | ..... | H04L 69/08 370/466 |
| 6,776,345 B1 * | 8/2004 | Liang | ...................... | G06F 1/181 235/441 |
| 7,108,559 B2 * | 9/2006 | Shtargot | ............... | H01R 12/722 439/638 |
| 8,446,729 B2 * | 5/2013 | Schuette | ............... | G06F 3/0626 235/441 |
| 8,538,479 B2 * | 9/2013 | Lee | ..................... | H04M 1/0277 29/601 |
| 8,638,551 B2 * | 1/2014 | Tsai | ..................... | G06K 7/0004 235/451 |

(Continued)

*Primary Examiner* — Xanthia C Cunningham
(74) *Attorney, Agent, or Firm* — Zhigang Ma (57) ABSTRACT

Router includes an enclosure, a circuit board located in the enclosure, a first expansion module, and a second expansion module. The first expansion module and the second expansion module are selectively coupled to the circuit board. When the first expansion module is coupled to the circuit board, the router is used to build a local area network or a wireless network. When the second expansion module is coupled to the circuit board, the router is used to connect a plurality of electronic devices.

16 Claims, 8 Drawing Sheets

(56) References Cited

U.S. PATENT DOCUMENTS

| | | | |
|---|---|---|---|
| 2003/0135681 A1* | 7/2003 | Laity | G06F 13/385 |
| | | | 710/303 |
| 2004/0257919 A1* | 12/2004 | Hsieh | G06K 7/0004 |
| | | | 369/1 |
| 2005/0120165 A1* | 6/2005 | Liang | G06K 7/0013 |
| | | | 711/103 |
| 2006/0082973 A1* | 4/2006 | Egbert | H05K 7/20154 |
| | | | 361/709 |
| 2007/0205281 A1* | 9/2007 | Tsuyuguchi | G06F 1/181 |
| | | | 235/451 |
| 2008/0019086 A1* | 1/2008 | Kim | G06F 1/1601 |
| | | | 361/679.01 |
| 2008/0194121 A1* | 8/2008 | Chang | G06F 1/1632 |
| | | | 439/59 |
| 2010/0149737 A1* | 6/2010 | Shtargot | H05K 7/1492 |
| | | | 361/679.02 |
| 2014/0111934 A1* | 4/2014 | Chang | G06F 13/382 |
| | | | 361/679.41 |
| 2014/0168904 A1* | 6/2014 | Malasani | H05K 1/141 |
| | | | 361/720 |

* cited by examiner

ROUTER

FIELD

The subject matter herein generally relates to a router.

BACKGROUND

A router can be utilized for building a local area network or a wireless network, thereby allowing more electronic devices to be connected.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a router. The router includes an enclosure, a circuit board located in the enclosure, a first expansion module, and a second expansion module. The first expansion module and the second expansion module are selectively coupled to the circuit board. When the first expansion module is coupled to the circuit board, the router is used to build a local area network or a wireless network. When the second expansion module is coupled to the circuit board, the router is used to connect a plurality of electronic devices.

Figure 1:
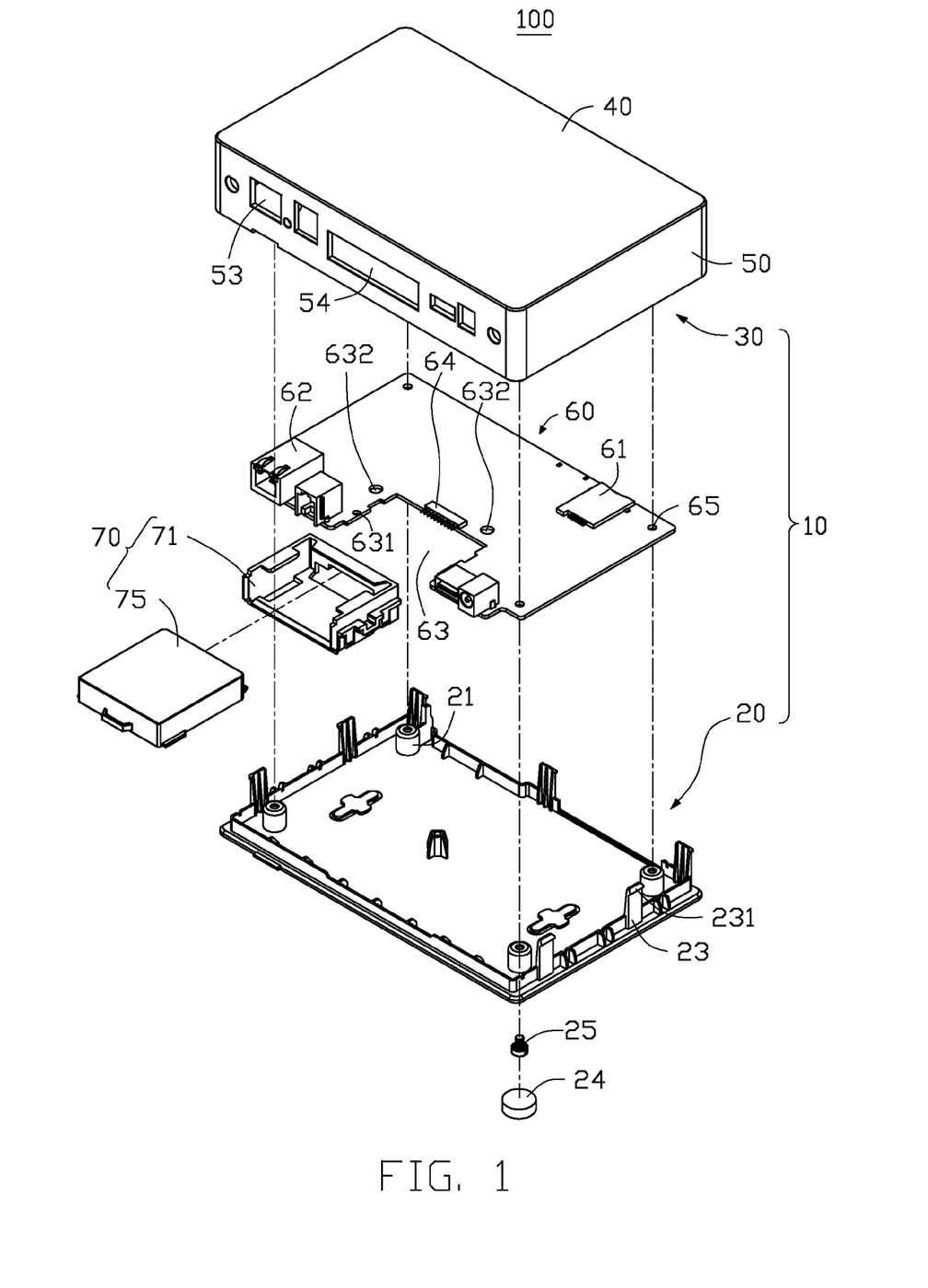
FIG. 1 is an exploded, isometric view of a first embodiment of a router.
Figure 2:
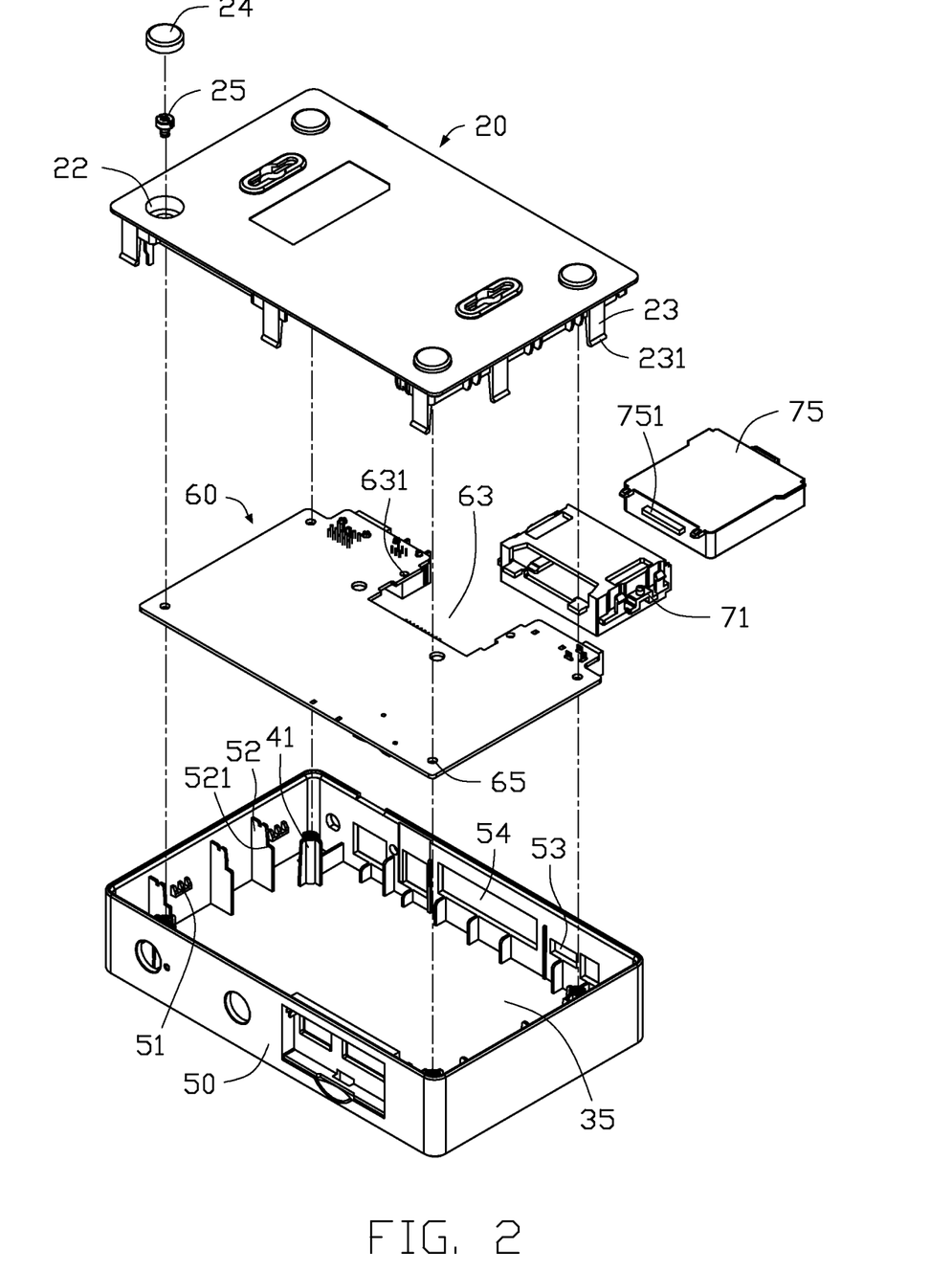
FIG. 2 is similar to FIG. 1, but viewed from a different angle.

FIGS. 1 and 2 illustrate an embodiment of a router 100. The router 100 includes an enclosure 10, a circuit board 60, a first expansion module 70 and a second expansion module 80 (see FIG. 6). The first expansion module 70 and the second expansion module 80 can be selectively coupled to the circuit board 60. In at least one embodiment, the first expansion module 70 can be a utility smart network access port (USNAP) module that is configured to build a local area network or a wireless network, and the second expansion module 80 can be a slave board that is configured to connect a plurality of electronic devices (not shown).

The enclosure 10 includes a bottom plate 20 and a covering element 30 attached to the bottom plate 20. Four positioning posts 21, each with a positioning hole 22, are located on the bottom plate 20. A plurality of clipping members 23, each with a hook 231, is located on edges of the bottom plate 20. The plurality of clipping members 23 is configured to engage with the covering element 30 to secure the bottom plate 20 to the covering element 30.

The covering element 30 can include a covering plate 40 and four side plates 50 extending from four edges of the covering plate 40. The covering plate 40 and the four side plates 50 can cooperatively define a receiving space 35 for receiving a circuit board 60. Four mounting posts 41, corresponding to the four positioning posts 21, are located on four corners of the covering plate 40. A plurality of engaging blocks 51 is located on the four side plates 50 and is configured to engage with the hook 231. A plurality of limiting plates 52, each with a cutout 521, is located on the four side plates 50 to position the circuit board 60. In at least one embodiment, each limiting plate 52 is substantially perpendicular to the four side plate 50 and the covering plate 40. A plurality of aligning holes 53 and an opening 54 are defined in one of the four side plates 50.

A chip 61 is located on a first side of the circuit board 60, and a plurality of connecting ports 62 is located on a second opposite side of the circuit board 60. An accommodating space 63 is defined in the second opposite side of the circuit board 60. A connector 64 is located on the circuit board 60 and arranged at an edge of accommodating space 63. Two securing holes 631 are defined in the circuit board 60 and arranged at opposite side edge of the accommodating space 63. Four mounting holes 65 are defined in the four corners of the circuit board 60. A screw 24 can extend through each positioning hole 22 and each mounting hole 65 to engage with the each of the four mounting posts 41, thereby the bottom plate 20 can be secured to the circuit board 60 and the covering element 30. Two retaining holes 632 are defined in the circuit board 60 and adjacent to the accommodating space 63.

Figure 3:
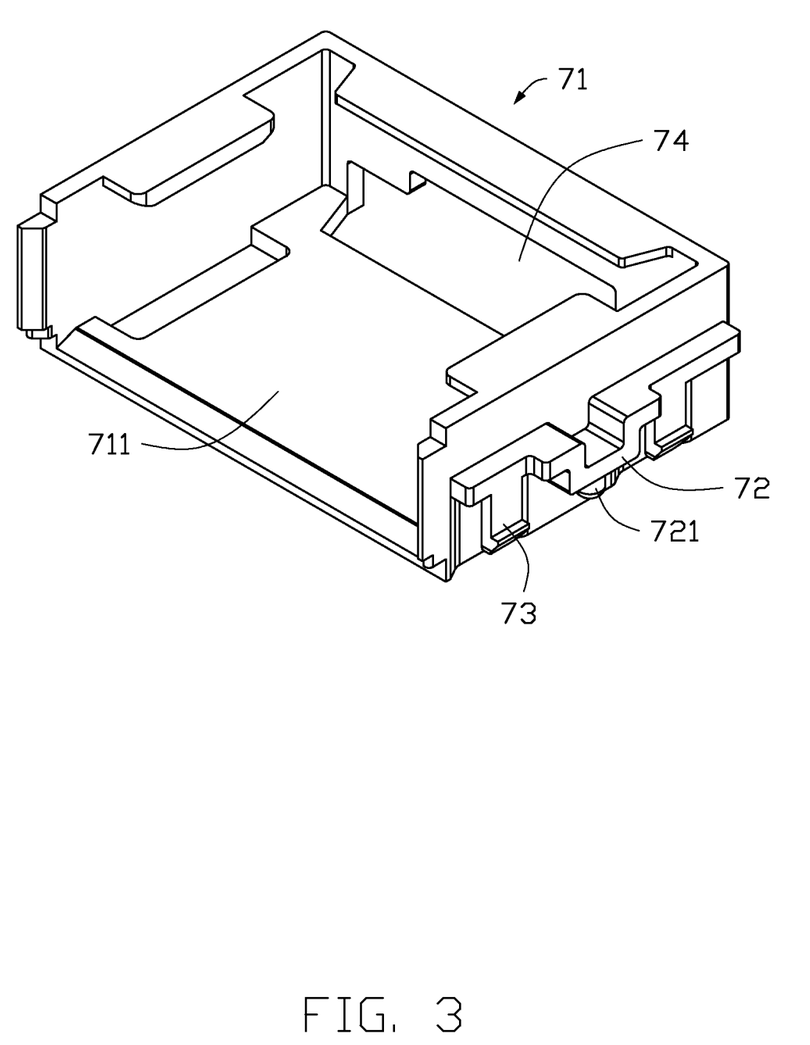
FIG. 3 is an isometric view of a securing member of the router of FIG. 1.
Figure 4:
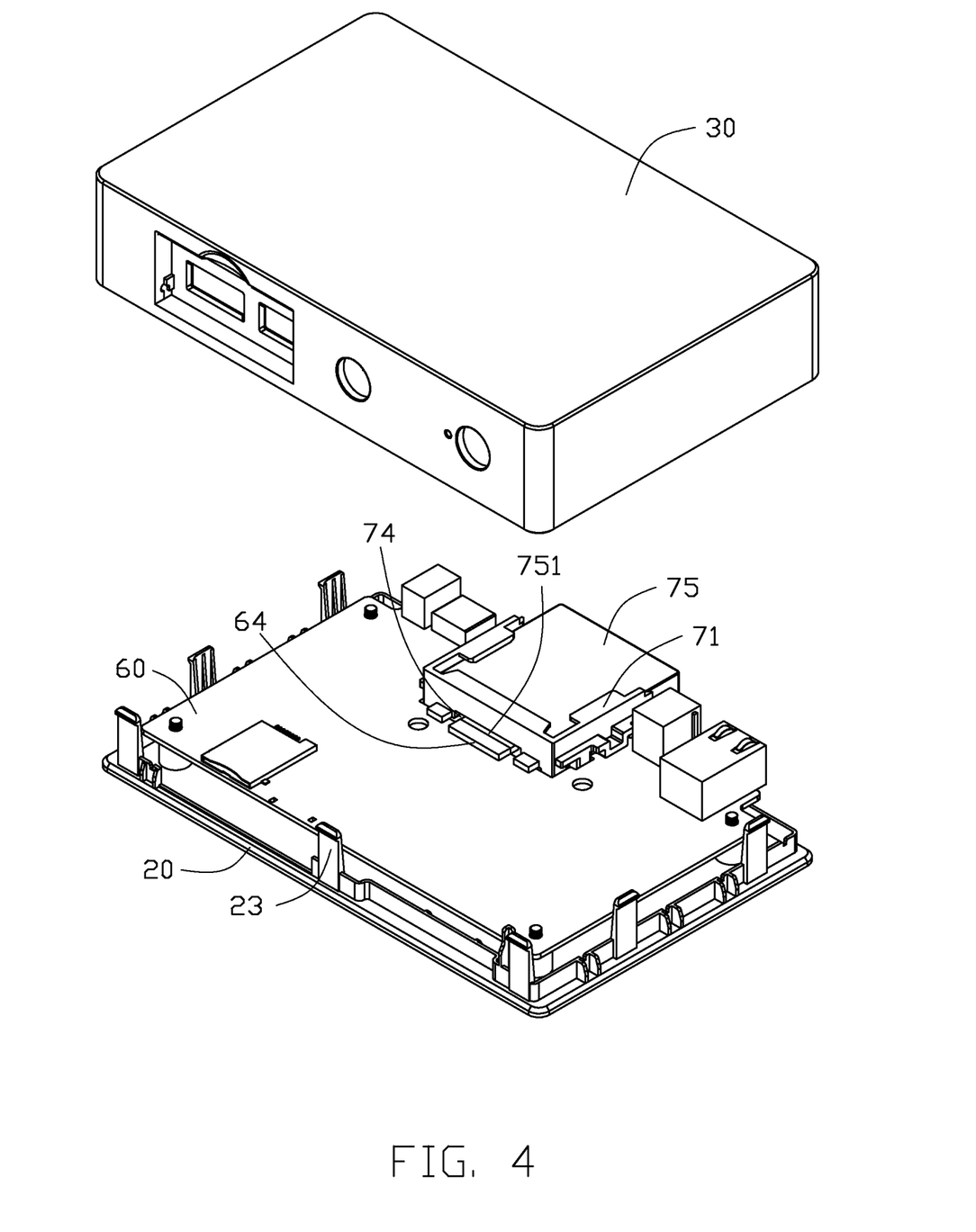
FIG. 4 is similar to FIG. 2, but a circuit board and a first expansion module are secured to a bottom plate.
Figure 5:
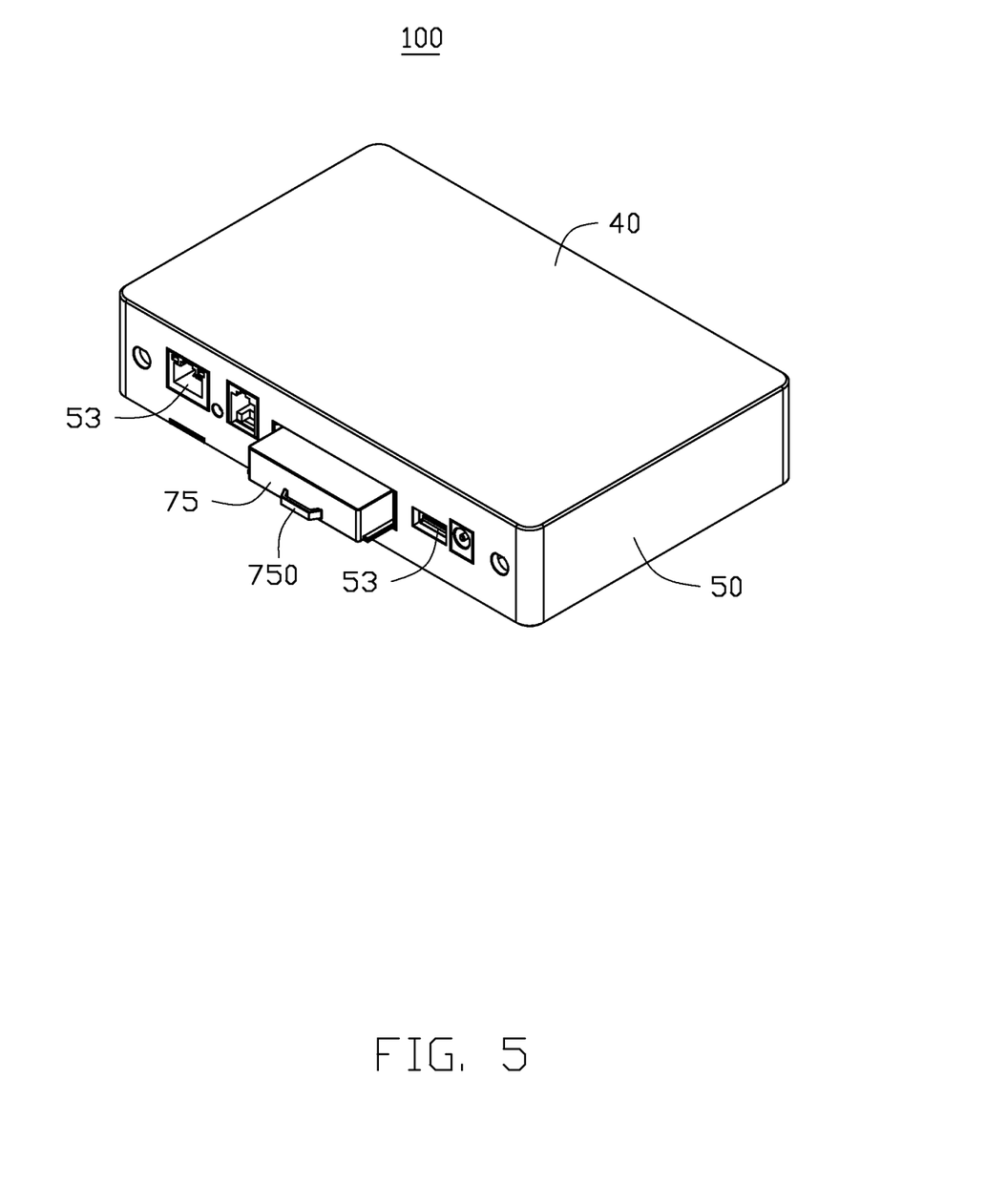
FIG. 5 is an assembled view of the router of FIG. 1.

FIGS. 1, 2 and 3 illustrate an embodiment of the first expansion module 70. The first expansion module 70 can include a securing member 71 and an expansion member 75 slidably attached to the securing member 71. The securing member 71 defines a receiving portion 711 configured for receiving the expansion member 75. A first securing portion 72 and two second securing portions 73 are located on each side of the securing member 71. A protruding tab 721 extends from the first securing portion 72 and is configured to engage in the securing hole 631. Each second securing portion 73 can be a hook which is configured to clip with the edges of the circuit board 60 that is adjacent to the accommodating space 63. A through hole 74 is defined in the first expansion module 70. The expansion member 75, with a handle 750 (see FIG. 5), is used to build the local area network or the wireless network, and a connecting module 751 is located on an end of the expansion member 75. The connecting module 751 can extend through the through hole 74 to connect to the connector 64.

Figure 6:
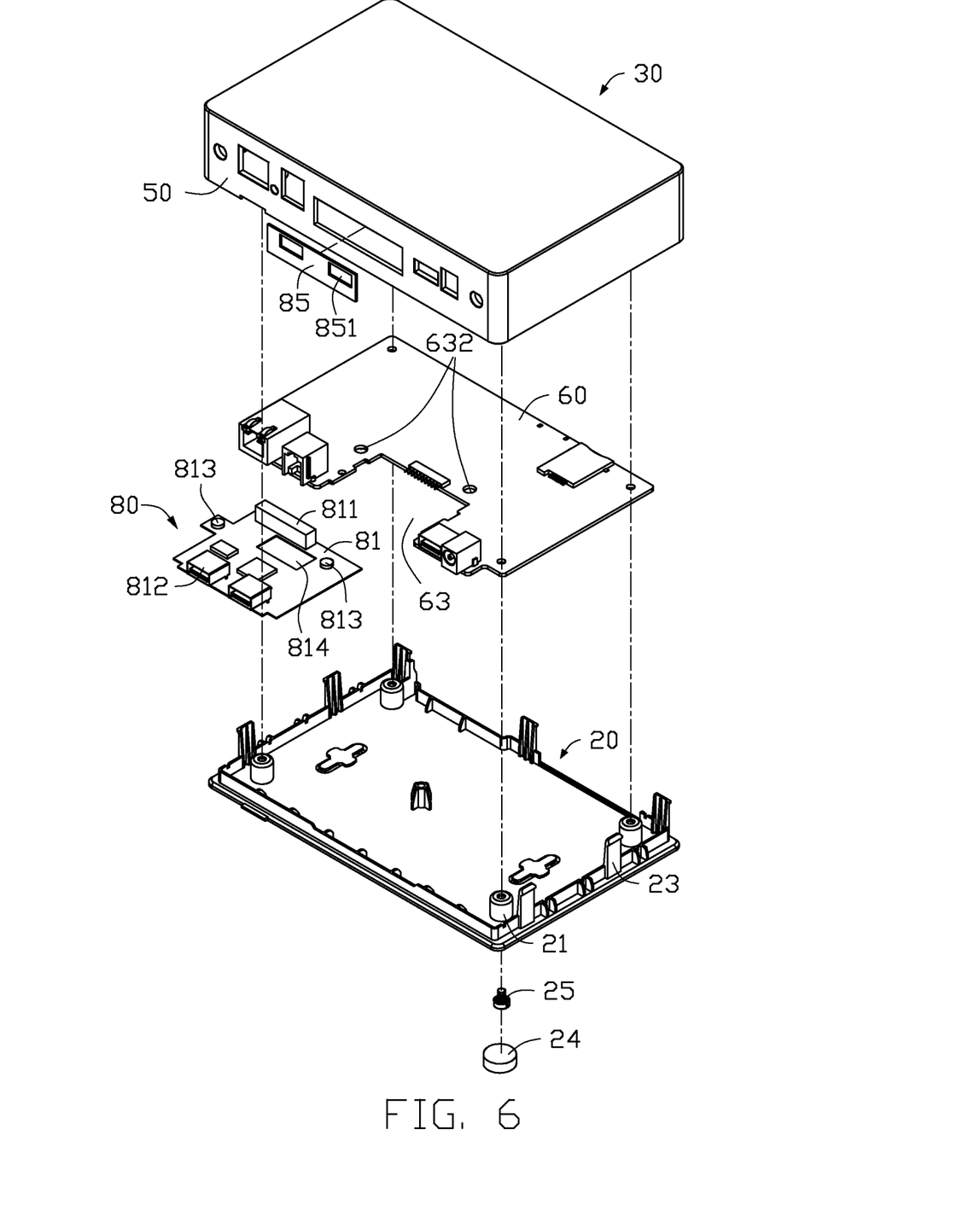
FIG. 6 is an exploded, isometric view of a second embodiment of a router.

FIG. 6 illustrates an embodiment of the second expansion module 80. The second expansion module 80 can include a motherboard 81 and a transfer board 85 located on the covering element 30. The transfer board 85 defines two exposing holes 851. A plurality of electronic components 811 and two coupling ports 812 are located on the motherboard 81. The second expansion module 80 can be electronically connected to the circuit board 60, the plurality of electronic components 811 is configured to process signal from the circuit board 60, thereby the two coupling ports 812 can be coupled to other electronic devices (not shown). Two fixing posts 813, corresponding to the two retaining holes 632, are located on the motherboard 81, and a receiving hole 814 is defined in the motherboard 81.

FIGS. 2, 3, 4 and 5 illustrate an embodiment of the first expansion module 70 being secured to the circuit board 60. In assembly, the securing member 71 is located in the accommodating space 63, the protruding tabs 721 engage in the securing holes 631, and each second securing portion 73 clips with the edges of the circuit board 60 that is adjacent to the accommodating space 63. Therefore, the securing member 71 is secured to the circuit board 60.

The circuit board 60 is located on the bottom plate 20, and the mounting holes 65 are aligned with the positioning holes 22. The covering element 30 covers the bottom plate 20 for allowing the circuit board 60 to be positioned by the limiting plates 52, and the four mounting posts 41 are aligned with the positioning holes 22. The screws 25 extend through the positioning holes 22 and the mounting holes 65 to engage with the four mounting post 41, the plurality of clipping members 23 is engaged with the covering element 30 to secure the bottom plate 20 to the covering element 30. In this position, the opening 54 is aligned with the securing member 71, and the through hole 74 is aligned with the connector 64. The expansion member 75 extends through the opening 54 and the through hole 74 for allowing the connecting module 751 to be connected to the connector 64. Therefore, the first expansion module 70 is secured to the circuit board 60, and the router 100 can be used to build a local area network or a wireless network.

Figure 7:
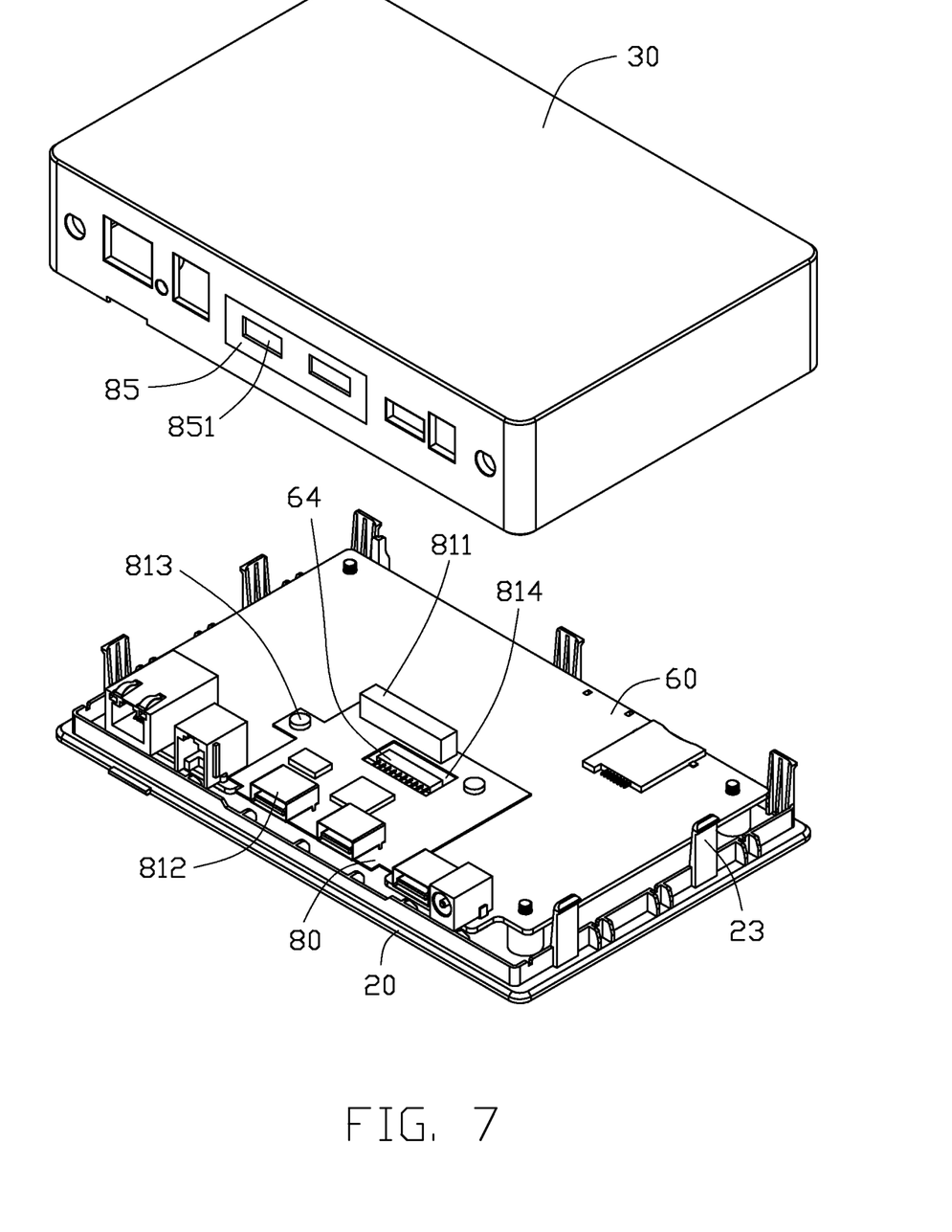
FIG. 7 is similar to FIG. 6, but the circuit board and a second expansion module are secured to the bottom plate.
Figure 8:
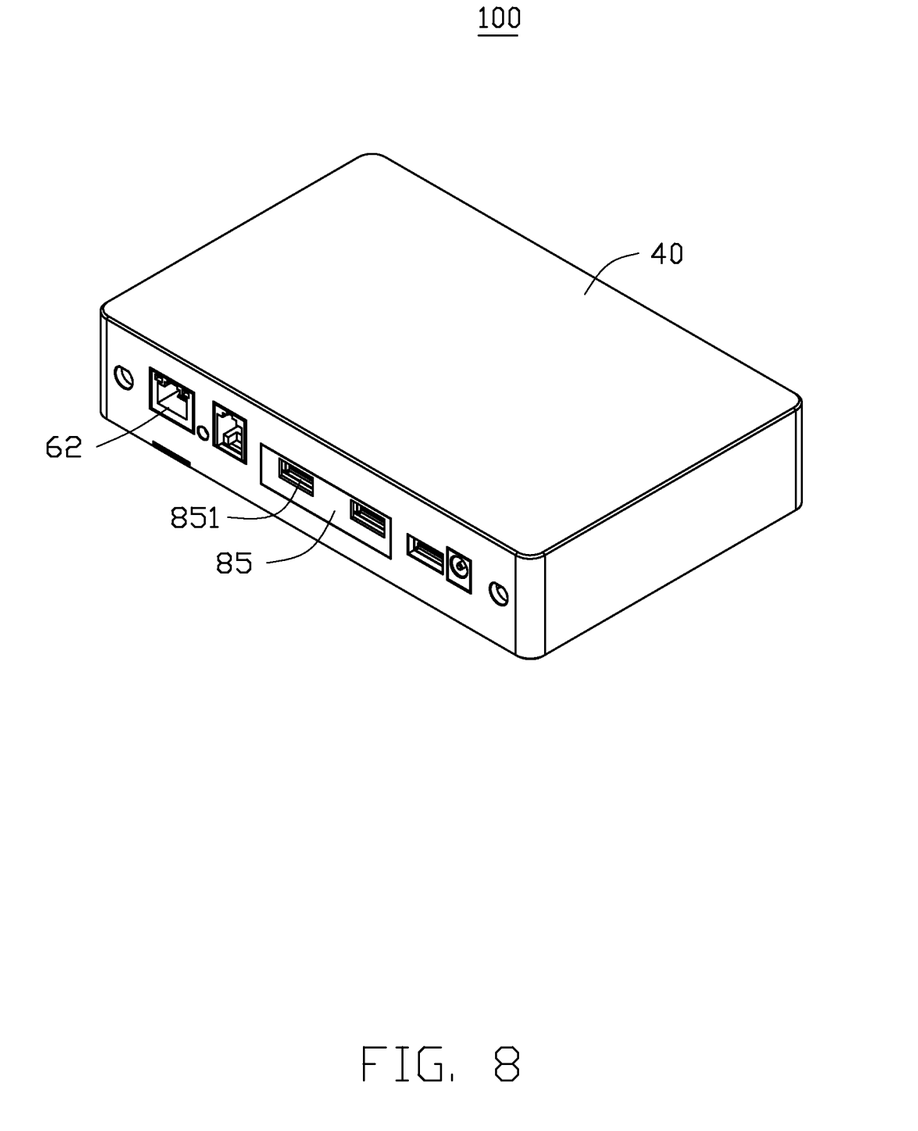
FIG. 8 is an assembled view of the router of FIG. 6.

FIGS. 6, 7 and 8 illustrate an embodiment of the second expansion module 80 being secured to the circuit board 60. In assembly, the second expansion module 80 is received in the accommodating space 63, the connector 64 is received in the receiving hole 814, and the two fixing posts 813 are engaged in the two retaining holes 632 to secure the second expansion module 80 to the circuit board 60.

The circuit board 60 is located on the bottom plate 20, and the mounting holes 65 are aligned with the positioning holes 22. The covering element 30 covers the bottom plate 20 allowing the circuit board 60 to be positioned by the limiting plates 52, and the four mounting posts 41 are aligned with the positioning holes 22. The screws 25 extend through the positioning holes 22 and the mounting holes 65 to engage with the four mounting post 41, the plurality of clipping members 23 is engaged with the covering element 30 securing the bottom plate 20 to the covering element 30, thereby the covering element 30 is secured to the bottom plate 20. At this position, the transfer board 85 is received in the opening 54, and each of the two exposing holes 851 is aligned with each of the two coupling ports 812 to allow each of the two coupling ports 812 to be exposed by each of the two exposing holes 851. Therefore, the router 100 can be a slave board that is configured to connect a plurality of electronic devices by the two coupling ports 812.

The embodiments shown and described above are only examples. Many details are often found in the art such as the other features of a router. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A router comprising:
   an enclosure;
   a circuit board located in the enclosure, and the circuit board defining an accommodating space;
   a first expansion module, at least a portion of the first expansion module being selectively receivable within the accommodating space and couplable to the circuit board; and
   a second expansion module, at least a portion of the second expansion module being selectively receivable within the accommodating space and couplable to the circuit board;
   wherein, with the first expansion module coupled to the circuit board the router is configured to establish a wireless network; and
   wherein, with the second expansion module coupled to the circuit board the router is configured to be connectable to one or more electronic devices.

2. The router of claim 1, wherein the first expansion module further comprises a securing member secured to the circuit board and an expansion member slidably received in the securing member, and the expansion member is connected to the circuit board.

3. The router of claim 2, wherein the circuit board defines a securing hole, and the securing member comprises a protruding tab engaged in the securing hole.

4. The router of claim 2, wherein the expansion member comprises a coupling module, and a connector is located on the circuit board to connect to the coupling module.

5. The router of claim 4, wherein the expansion member defines a through hole, and the coupling module extends through the through hole to connect to the connector.

6. The router of claim 1, wherein the second expansion module comprises a motherboard, and a plurality of coupling ports are located on the motherboard and configured to connect the plurality of electronic devices.

7. The router of claim 6, wherein the second expansion module further comprises a transfer board attached to the enclosure, and a plurality of exposing holes is defined in the transfer board for allowing the plurality of coupling ports to expose out of the enclosure.

8. The router of claim 7, wherein the motherboard defines a receiving hole, when the motherboard is secured to the circuit board, the connector is received in the receiving hole.

9. A router comprising:
- an enclosure comprising a bottom plate and a covering element engaged with the bottom plate; and
- a circuit board attached to the bottom plate and received in the enclosure; the circuit board defining an accommodating space;
- wherein, at least a portion of a first expansion module is selectively receivable within the accommodating space and couplable to the circuit board, and with the first expansion module coupled to the circuit board the router is configured to establish a wireless network; and
- wherein, at least a portion of a second expansion module is selectively receivable within the accommodating space and couplable to the circuit board, and with the second expansion module coupled to the circuit board the router is configured to be connectable to one or more electronic devices.

10. The router of claim 9, wherein the first expansion module comprises a securing member secured to the circuit board and an expansion member slidably received in the securing member, and the expansion member is connected to the circuit board.

11. The router of claim 10, wherein the circuit board defines a securing hole, and the securing member comprises a protruding tab engaged in the securing hole.

12. The router of claim 10, wherein the expansion member comprises a coupling module, and a connector is located on the circuit board to connect to the coupling module.

13. The router of claim 12, wherein the expansion member defines a through hole, and the coupling module extends through the through hole to connect to the connector.

14. The router of claim 9, wherein the second expansion module comprises a motherboard, and a plurality of coupling ports are located on the motherboard and configured to connect the plurality of electronic devices.

15. The router of claim 14, wherein the second expansion module further comprises a transfer board attached to the enclosure, and a plurality of exposing holes is defined in the transfer board for allowing the plurality of coupling ports to expose out of the enclosure.

16. The router of claim 15, wherein the motherboard defines a receiving hole, when the motherboard is secured to the circuit board, the connector is received in the receiving hole.

* * * * *